United States Patent [19]

Lee

[11] Patent Number: 4,626,713

[45] Date of Patent: Dec. 2, 1986

[54] TRIP-POINT CLAMPING CIRCUIT FOR A SEMICONDUCTOR DEVICE

[75] Inventor: Robert D. Lee, Denton, Tex.

[73] Assignee: Thomson Components-Mostek Corporation, Carrollton, Tex.

[21] Appl. No.: 648,093

[22] Filed: Sep. 6, 1984

[51] Int. Cl.⁴ .............................................. H03K 17/14
[52] U.S. Cl. .................... 307/548; 307/491; 307/494; 307/351; 307/363
[58] Field of Search ...................... 307/200 B, 443, 491, 307/494, 496–497, 530, 351, 363, 548, 297; 330/253, 257, 261

[56] References Cited

U.S. PATENT DOCUMENTS

| | | | |
|---|---|---|---|
| 4,249,095 | 2/1981 | Hsu | 330/253 X |
| 4,333,057 | 6/1982 | Hoover | 330/253 |
| 4,438,349 | 3/1984 | Shoji | 307/359 X |
| 4,438,388 | 3/1984 | Lee | 307/297 X |
| 4,477,737 | 10/1984 | Ulmer et al. | 307/491 X |
| 4,527,076 | 7/1985 | Matsuo et al. | 307/494 X |
| 4,554,515 | 11/1985 | Burson et al. | 330/253 X |
| 4,563,601 | 1/1986 | Asano et al. | 307/443 X |

Primary Examiner—Stanley D. Miller
Assistant Examiner—D. R. Hudspeth

[57] ABSTRACT

A trip point clamping circuit for maintaining the voltage level at a node of connection to a sense arrangement including an inverter within defined bounds at the trip point of the inverter, the clamping circuit including a reference voltage, a source of similar current levels, a switch for turning the clamping circuit on and off, and a transistor responsive to the voltage level at said node of connection.

1 Claim, 5 Drawing Figures

TRIP-POINT CLAMPING CIRCUIT FOR A SEMICONDUCTOR DEVICE

TECHNICAL FIELD

The field of the invention is that of voltage clamping circuit for a voltage state sensing circuit at the output of a low-drive-current highly capacitive, state indicating device.

BACKGROUND ART

It is well known, to monitor the sense node of highly capacitive, low-drive current state indicating device such as for example a semiconductor memory by connecting the sense node to a sensing scheme including an inverter element followed by several amplifier stages.

In order to change the state of the sensing inverter, the sense node must be slewed beyond its trip point. The slew rate for moving the node past the trip point cannot increase merely by designing the state indicating or memory device to deliver more current to the sense node for slewing. An attempt to supply an increased level of current to the node would only increase the capacitance seen by the node, in effect maintaining the slew rate at about the same level as a result of the increased capacitance in the memory device resulting from its ability to supply the additional current.

Accordingly, it is an object of the invention to clamp the voltage swing of the output node of the state indicating device or memory between selected limits straddling the expected trip point of the sensing device connected to the node.

DISCLOSURE OF THE INVENTION

According to the invention herein, the swing of a sense node is clamped between a range of voltages straddling the trip point of the sensing device, thereby reducing the slew time in which the node reaches the trip point and increasing the effective speed of the device.

BEST MODE FOR CARRYING OUT THE INVENTION

Figure 1:
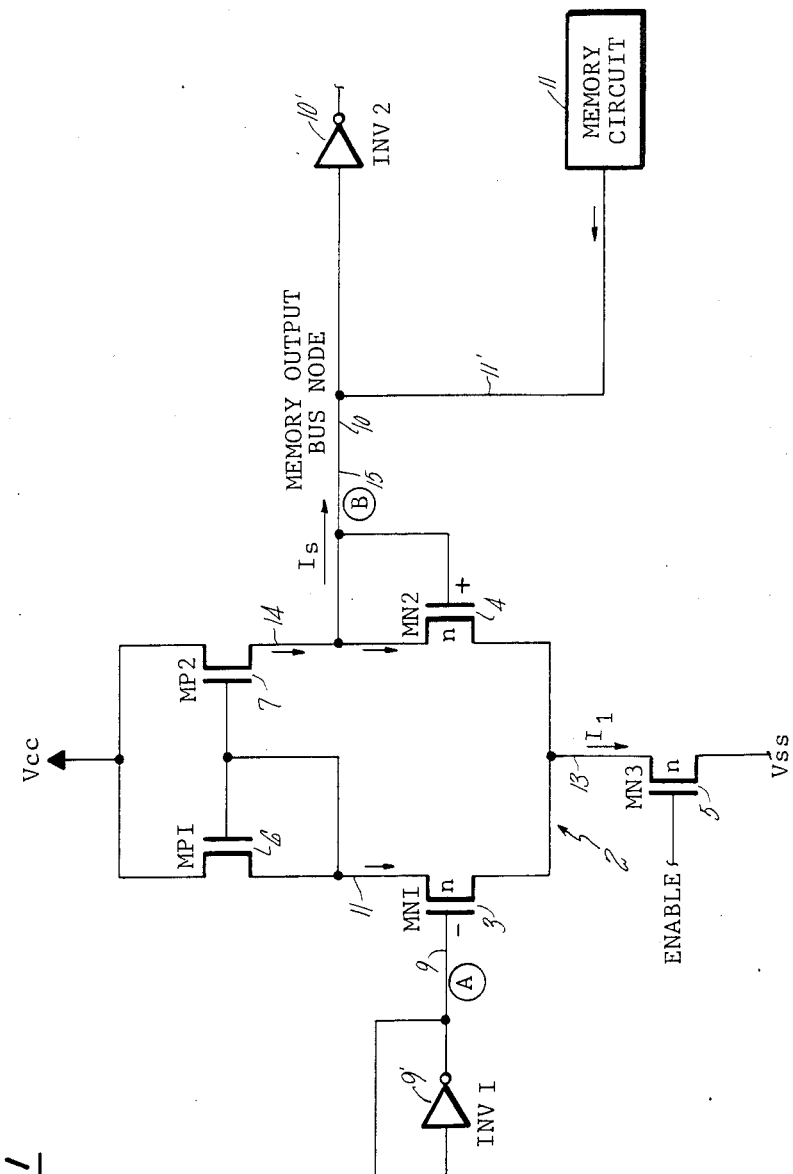
FIG. 1 shows a schematic of the trip-point clamping circuit according to this invention.

FIG. 1 shows a semiconductor trip-point clamping circuit according to the invention herein. The clamping circuit includes a suitable source of a sinking or sourcing current, which in this case is a differential amplifier 2 including MOS or bipolar transistors 3 through 7, designated respectively as MN1, MN2, MN3, MP1 and MP2. In the arrangement of FIG. 1, the differential amplifier operates upon negative and positive nodes 9 and 10. The negative input of the differential amplifier is shorted to the output node of the differential amplifier, thereby establishing a unity gain configuration for the differential amplifier. Node 9 serves as a reference node maintained at a selected voltage which is equal to the trip point of the state sensing logic gate 10' which in this case in an inverter. Node 10 is the output node of the circuit to be clamped. The circuit 11 to be clamped can be a memory circuit or any one of a number of driver circuits that have a low output current device capability and significance output capacitance. As a result, they have slow slew rates effective for modifying the voltage level of the driven output nodes. Inverter 9' establishes the reference voltage level at node 9 holding node 10 also at the trip point of the sensing device.

If the voltage at reference node 9 equals the voltage at output node 10, the current through upper branches 11 and 12 of the sense amplifier contributes equally to the combined current in branch 13 connected at the ends of branches 11 and 12. In other words, $I_{11}=I_{12}=I_{13}/2$; where $I_{11}$ is the current in branch 11; $I_{12}$ is the current in branch 12; and $I_{13}$ is the current in branch 13.

Additionally, transistors 6 and 7, i.e. MP1 and MP2 respectively, establish a current mirror effect which insures that the current through branch 14 is the same as through branch 11. It thus follows that: $I_{14}=I_{12}$, and $I_{15}=I_{14}-I_{13}=0$; where $I_{14}$ is the current in branch 14; and amd $I_{15}$ is the current in branch 15.

Accordingly, if node 10 goes to a higher voltage than node 9, which will happen if the circuit to be clamped provides a source current, then more current flows through MN2 than through MN1. For small changes in the voltage dV between nodes 9 and 10, it is true that: $I_{13}=I_{11}/2+g_{m,NM2} * dV/2$; and $I_{12}=I_{11}/2-g_{gm,MN1} * dV/2$; where $g_{m,MN2}$ is the transconductance of transistor 4 (i.e. MN2); and $g_{m,MN1}$ is the transconductance of transistor 3 (i.e. MN1).

Since MN1 and MN2 are identical, their transconductances are, of course, the same. Accordingly, $g_{m,MN2}=g_{m,MN1}=g_{mn}$; where $g_{mn}$ represents the generalized conductance of either transistor 3 or 4, i.e. MN1 or MN2. Thus: $I_{13}=I_{11}/2+g_{mn} * dV/2$; and $I_{12}=I_{11}/2-g_{mn} * dV/2$. Also, since $I_{14}=I_{12}$, $I_{14}=I_{11}/2-g_{mn} * dV/2$.

Because $I_{15}=I_{14}-I_{13}$, and $I_{15}=I_{11}/2-g_{mn} * dV/2-I_{11}/2+g_{mn} * dV/2$; it follows that: $I_{15}=g_{mn} * dV$. In other words, a small positive voltage change dV between nodes 10 and 9 causes a responsive sinking current to ground from output node 10, which opposes the rise in voltage dV caused by the source current indicated above.

Similarly, if node 10 decreases (−dV) due to a sink current from device 11 to a voltage lower than that set at reference node 9, more current will flow through transistor MN1 than through transistor MN2, causing $I_{15}$ to increase in a positive direction and resulting in responsive current being provided to node 10 from $V_{cc}$, which opposes any voltage drop at output node 10.

For large changes dV in voltage, the clamping current follows the MOS current relationship: $I_{15}$ is proportional to $(dV/2-V_{TR})^2$, where: $I_{15}$ is the clamping current at node 10; dV is the change in voltage at output node 10 with respect to the reference voltage at node 9; and $V_{TR}$ is the reference voltage at node 9 corresponding to the desired trip point voltage to be straddled.

Figure 2:
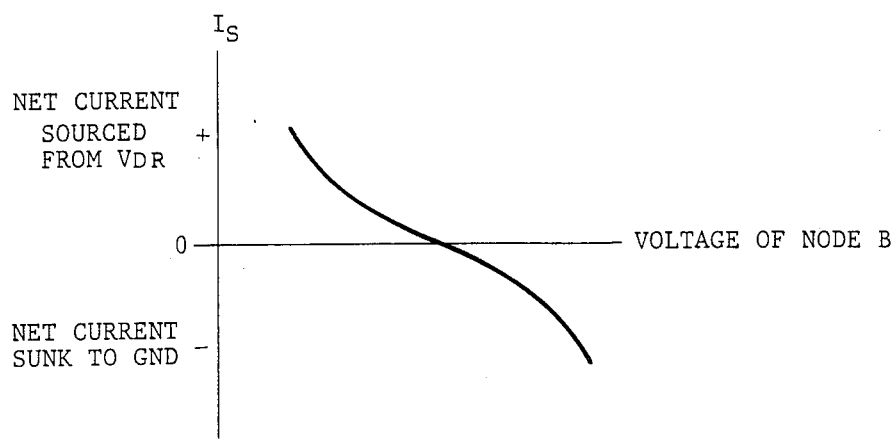
FIG. 2 is a graph of the current sunk or sourced from ground or $V_{DD}$ as a function of the voltage at node B.

This relationship is illustrated in FIG. 2, which shows the change in clamping current $I_{15}$ with voltage at output node 10. In this Figure, the current $I_{15}$ is zero when the voltages at respective nodes 9 and 10 are equal.

Inverter 9' has its output shorted to its input, forcing it to operate to its own trip point. Further, node 10 is held at the trip point of inverter 9', since inverters 9' and 10' are of necessity identical devices. By making the logic gate in the reference voltage setting device identical to the logic gate used for the stile sensing device, it is insured that the clamping range straddles the central trip point of the sensing device, which is a key action of the invention herein. Inverters 9' and 10' can be a logic gate other than an inverter including a NAND gate or NOR gate having an enable input to select or deselect its operation as an inverter.

The sense circuit or arrangement including inverter 10' to be clamped will either tend to pull node 10 high or low in response to the stage of the circuit being claimed (i.e. is it trying to go high or low? That is, is it sending or sourcing current?) as the case requires. Since the clamp circuit has a finite output impedance, output node 10 will be able to swing about the trip point of inverter 10'.

Figure 3:
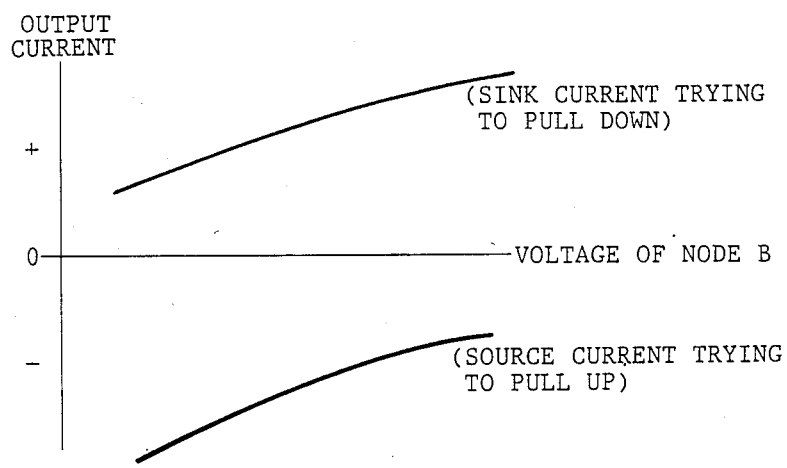
FIG. 3 is a graph of the output current from the circuit to be clamped as a function of voltage at node B.
Figure 4:
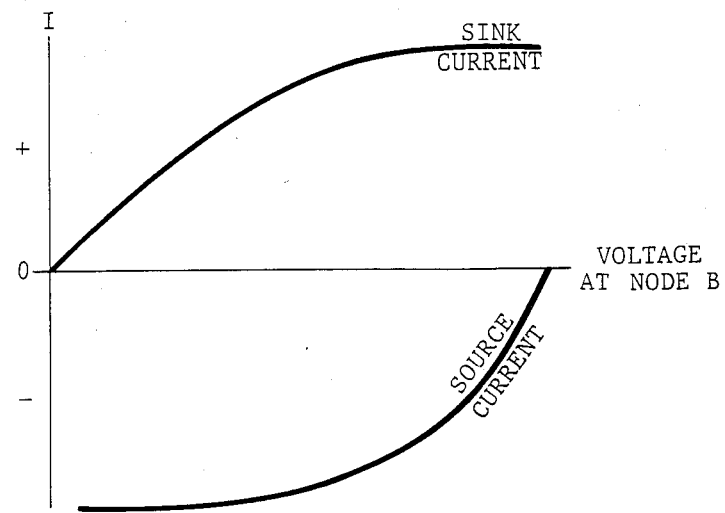
FIG. 4 is a graph of output current sunk or sourced from $V_{CC}$ to ground or ground to $V_{CC}$.

FIG. 3 shows an example in which the output current $I_{11}$ of the circuit to be clamped is plotted against the voltage of node 10, for both drive states of pull-up and pull-down. The significance of this in the case of FIG. 3 is that, if you are sinking current and node is far from the trip point, it takes a long time to change the state of the output node 13. FIG. 4 shows a special case of FIG. 3 in which the drive is an inverter with its gate as $V_{ss}$ (ground) or $V_{cc}$, i.e. output current in' versus the voltage at node 10.

Figure 5:
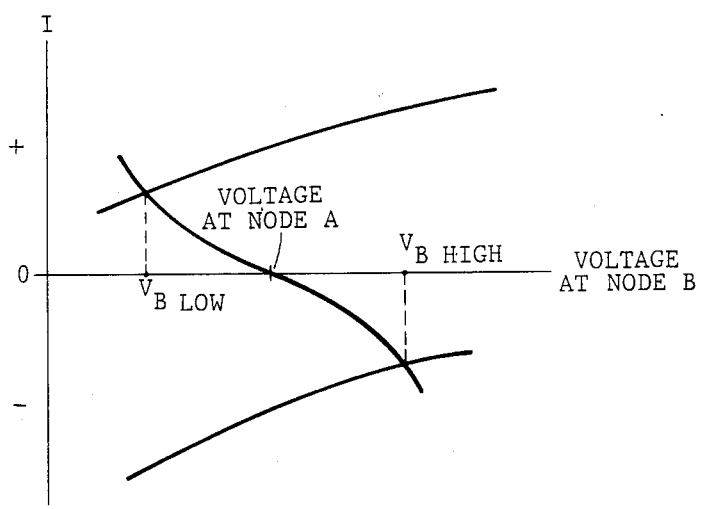
FIG. 5 is a graph combining FIG. 2 and FIG. 4 showing how voltage at node B is clamped between selected limits.

FIG. 5 combines the current curves of FIGS. 3 and 4. The intersection of the curves shown defines two stable operating points or voltages, $V_{10,low}$ and $V_{10,high}$ which will be the ultimate node voltages to which the circuit 11 can drive node 10.

The circuit accordingly clamps at $V_{10,low}$ and $V_{10,high}$. The clamp action can be tightened by increasing the drive of the differential amplifier including transistors MN1, MN2, MN3, MP1 and MP2 shown in FIG. 1.

It follows that node 10 can be clamped to swing a very small amount about the trip point of inverter 10'. The various transistors 3-7 of the differential amplifier arrangement can be based upon a p-channel or n-channel differential pair of transistors.

The circuit of the invention accordingly clamps the output memory node 10 near the trip point of the output inverter, enabling very tight voltage clamping effective to limit the swing of the high-capacitance output node 10 to a small swing, thus greatly increasing the speed of the device.

The above information may lead others skilled in the art to develop similar arrangements nonetheless falling within the scope of the invention addressed herein. It is accordingly urged that reference be made to the claims which follow, as these specify with particularity the metes and bounds of the invention.

I claim:

1. A trip-point clamping circuit for a semiconductor device including an output node connected to a sensing device comprising inverter means for establishing a reference voltage level;

current means for maintaining the same current level on each of a first and a second element output in the absence of a signal at said output node, first transistor means including a control gate coupled to the inverter means, a first current-carrying terminal coupled to the first current output and a second current carrying terminal, second transistor means for responding to the voltage level at said output node including a control gate coupled to the output node, a first current carrying terminal coupled to the output node and to the second current output and a second current-carrying terminal, and switch means supplied with current from the second current-carrying terminals of the first and second transistor means whereby the current to said switch means is varied by signals on said output node.

* * * * *